(12) United States Patent
Kim et al.

(10) Patent No.: US 10,504,471 B2
(45) Date of Patent: Dec. 10, 2019

(54) HALF-POWER BUFFER AND/OR AMPLIFIER

(71) Applicant: DB HiTek Co., Ltd., Bucheon-si (KR)

(72) Inventors: Mun Gyu Kim, Seoul (KR); Seung Jin Yeo, Anyang-si (KR); Dong Gwi Choi, Seoul (KR); Kyoung Tae Kim, Seoul (KR)

(73) Assignee: DB HiTek, Co., Ltd., Bucheon-Si (KR)

( * ) Notice: Subject to any disclaimer, the term of this patent is extended or adjusted under 35 U.S.C. 154(b) by 0 days.

(21) Appl. No.: 15/918,919

(22) Filed: Mar. 12, 2018

(65) Prior Publication Data

US 2019/0080660 A1   Mar. 14, 2019

(30) Foreign Application Priority Data

Sep. 13, 2017   (KR) .......................... 10-2017-0117209

(51) Int. Cl.
*G09G 3/36*     (2006.01)
*H03F 1/02*     (2006.01)
*H03F 3/45*     (2006.01)

(52) U.S. Cl.
CPC ......... *G09G 3/3677* (2013.01); *H03F 1/0211* (2013.01); *H03F 3/45179* (2013.01); *G09G 2310/027* (2013.01); *G09G 2310/0289* (2013.01); *G09G 2310/0291* (2013.01); *G09G 2330/021* (2013.01); *H03F 2200/417* (2013.01); *H03F 2200/421* (2013.01)

(58) Field of Classification Search
CPC combination set(s) only.
See application file for complete search history.

(56) References Cited

U.S. PATENT DOCUMENTS

| 2009/0039959 A1* | 2/2009 | An ........................ H03F 3/3022 330/255 |
| 2010/0182297 A1* | 7/2010 | Lan ...................... G09G 3/3614 345/211 |

* cited by examiner

*Primary Examiner* — Deeprose Subedi
(74) *Attorney, Agent, or Firm* — Andrew D. Fortney; Central California IP Group, P.C.

(57) ABSTRACT

A half-power buffer and/or amplifier is disclosed. The half-power buffer and/or amplifier includes an amplifying unit including first and second transistors connected between a first voltage source having a first voltage and a third voltage source having a third voltage, and a first output node configured to connect the first and second transistors and to output a voltage over a first voltage range between the first and third voltages, a second output buffer unit including third and fourth transistors connected between a second voltage source having a second voltage and the third voltage source, and a second output node configured to connect the third and fourth transistors and to output a voltage over a second voltage range between the second and third voltages, and a first charge share switch unit connected between the gate of the second transistor and the first voltage source, and configured to perform a charge share and/or equalization operation.

18 Claims, 5 Drawing Sheets

HALF-POWER BUFFER AND/OR AMPLIFIER

This application claims the benefit of Korean Patent Application No. 10-2017-0117209, filed on Sep. 13, 2017, which is hereby incorporated by reference as if fully set forth herein.

BACKGROUND OF THE INVENTION

Field of the Invention

Embodiments of the present disclosure relate to a half-power buffer and/or amplifier.

Discussion of the Related Art

A liquid crystal display device generally includes pixels arranged in a matrix of rows and columns. Each pixel may include a thin film transistor and a pixel electrode on a substrate. Gates of thin film transistors in the same row may be connected to a gate line and controlled by a gate driver.

Sources of thin film transistors in the same column may be connected to a source line and may be controlled by a source driver.

When a liquid crystal display device has a relatively high resolution, an increased number of output buffers should be included in the source driver of the liquid crystal display device. In this case, power consumption increases due to the increased number of output buffers. In a portable display appliance, the power consumption of the liquid crystal display devices may determine the available run time (e.g., battery life). For this reason, the liquid crystal display of the portable appliance tends to employ low-power output buffers.

FIG. 4 shows a general half-power output buffer.

Referring to FIG. 4, during a first line time, a first buffer 11 for a first channel INP1 may output a first power or voltage in an upper half of a rail-to-rail power or voltage range, for example, VDD2M to VDD2, as a first output OUT1, in accordance with selective connection of a switching unit 15. At the same time, a second buffer 12 for a second channel INP2 may output a second power or voltage in a lower half of the rail-to-rail power or voltage range, for example, VSS2 to VDD2M, as a second output OUT2, in accordance with the selective connection of the switching unit 15.

During a second line time subsequent to the first line time, the first buffer 11 may output the first power or voltage as the second output OUT2 by the switching unit 15, and the second buffer 12 may output the second power or voltage as the first output OUT1. The switching unit 15 may perform a switching operation in response to a polarity control signal POL. The switching unit 15 may achieve dot inversion or provide a dot inversion function.

It may be impossible to appropriately remove offsets generated from or by the different buffers 11 and 12. As a result, display quality may degrade. For example, when the first buffer 11 and second buffer 12 have opposite offset directions, the offset characteristics and/or effects may accumulate. Although offset characteristics may be reduced by increasing the size of a matching pair (e.g., of the transistors in the buffers 11 and 12 and/or the switch 15), the chip area may increase as a result.

SUMMARY OF THE INVENTION

Accordingly, the present invention is directed to a half-power buffer and/or amplifier that substantially obviates one or more problems due to limitations and disadvantages of the related art.

An object of embodiments of the present disclosure is to provide a half-power buffer and/or amplifier capable of preventing generation of an abnormal output upon polarity inversion.

Additional advantages, objects, and features of the embodiments will be set forth in part in the description which follows and in part will become apparent to those skilled in the art upon examination of the following or may be learned from practice of one or more of the embodiments. The objectives and other advantages of the embodiments may be realized and attained by the structure(s) particularly pointed out in the written description and claims hereof, as well as the appended drawings.

To achieve these objects and other advantages and in accordance with the purpose of embodiments of the present disclosure, as embodied and broadly described herein, a half-power buffer and/or amplifier includes an amplifying unit (e.g., an amplifier) configured to differentially amplify first and second input signals (e.g., amplify a differential input signal), the amplifying unit including first to fourth nodes configured to output first to fourth amplified outputs; a first output buffer unit (e.g., a first output buffer) including (i) first and second transistors connected between a first voltage source having a first voltage and a third voltage source having a third voltage, and (ii) a first output node configured to connect the first and second transistors, the first and second transistors having gates connected to corresponding ones of the first and second nodes, respectively, the first output node being configured to output a voltage over a first voltage range between the first voltage and the third voltage; a second output buffer unit (e.g., a second output buffer) including (i) third and fourth transistors connected between a second voltage source having a second voltage and the third voltage source, and (ii) a second output node configured to connect the third and fourth transistors, the third and fourth transistors having gates connected to corresponding ones of the third and fourth nodes, respectively, the second output node being configured to output a voltage over a second voltage range between the second voltage and the third voltage; and a first charge share switch unit (e.g., a first equilibration switch) connected between the gate of the second transistor and the first voltage source, and configured to control the second transistor and/or equilibrate a voltage at the first output node with the third voltage in response to a first control signal.

The half-power buffer and/or amplifier may further include a second charge share switch unit (e.g., a second equilibration switch) connected between the gate of the third transistor and the second voltage source, configured to control the third transistor and/or equilibrate a voltage at the second output node with the third voltage in response to a second control signal.

The first voltage may be higher than the third voltage, and the second voltage is lower than the third voltage.

The half-power buffer and/or amplifier may further include a third output node configured to connect the first output node of the first output buffer unit and the second output node of the second output buffer unit.

The first charge share switch unit may include first and second switches connected between the first voltage source and the gate of the second transistor. The first switch may receive and/or be controlled by a first polarity control signal, and the second switch may receive and/or be controlled by a first charge share signal.

The first charge share switch unit may further include a third switch connected between the second node and the gate of the second transistor, and configured to float or electrically disconnect the first output buffer unit from the second node, in response to a third control signal.

The half-power buffer and/or amplifier may further include a first reset switch unit (e.g., a first reset switch) connected between the gate of the second transistor and the third voltage source, configured to reset the first output node of the first output buffer unit to the third voltage in response to a first reset control signal.

The first reset switch unit may reset the first output node of the first output buffer unit to the third voltage when equilibrating the second output node with the third voltage.

The second charge share switch unit may include fourth and fifth switches connected between the second voltage source and the gate of the third transistor. The fourth switch may receive and/or be controlled by the first polarity control signal, and the fifth switch may receive and/or be controlled by a second charge share signal.

The second charge share switch unit may further include a sixth switch connected to the third node and the gate of the third transistor, and configured to float or electrically disconnect the second output buffer unit from the third node, in response to a fourth control signal.

The half-power buffer and/or amplifier may further include a second reset switch unit (e.g., a second reset switch) connected between the gate of the third transistor and the third voltage source, configured to reset the second output node of the second output buffer unit to the third voltage in response to a second reset control signal.

The second reset switch unit may reset the second output node of the second output buffer unit to the third voltage when equilibrating the first output node with the third voltage.

The half-power buffer and/or amplifier may further include a first output switch unit (e.g., a first output switch) including a seventh switch (i) connected between the first node and the gate of the first transistor and (ii) configured to receive and/or be controlled by a third control signal, an eighth switch (i) connected between the second voltage source and the gate of the second transistor and (ii) configured to receive and/or be controlled by a fourth control signal, and a ninth switch (i) connected between the first voltage source and the gate of the first transistor and (ii) configured to receive and/or be controlled by a fifth control signal.

The half-power buffer and/or amplifier may further include a second output switch unit (e.g., a second output switch) including a tenth switch (i) connected between the fourth node and the gate of the fourth transistor and (ii) configured to receive and/or be controlled by the fourth control signal, an eleventh switch (i) connected between the first voltage source and the gate of the third transistor and (ii) configured to receive and/or be controlled by the third control signal, and a twelfth switch (i) connected between the second voltage source and the gate of the fourth transistor and (ii) configured to receive and/or be controlled by a sixth control signal.

The first reset switch unit may include thirteenth and fourteenth switches connected between the gate of the second transistor and the third voltage source. The thirteenth switch may receive and/or be controlled by a fifth control signal, and the fourteenth switch may receive and/or be controlled by a second polarity control signal.

The half-power buffer and/or amplifier may further include a fifteenth switch (i) connected between the gate of the third transistor and the third voltage source and (ii) configured to receive and/or be controlled by a sixth control signal, and a sixteenth switch (i) connected between the gate of the third transistor and the third voltage source and (ii) configured to receive and/or be controlled by the second polarity control signal.

The second polarity control signal may be an inverted first polarity control signal.

In another aspect of the invention, provided herein is a half-power buffer and/or amplifier including an amplifying unit (e.g., an amplifier) configured to differentially amplify first and second input signals (e.g., amplify a differential input signal), the amplifying unit including first to fourth nodes configured to output first to fourth outputs (e.g., differentially amplified outputs), a first output buffer unit (e.g., a first output buffer) including first and second transistors connected between a first voltage source having a first voltage and a third voltage source having a third voltage, and a first output node configured to connect the first and second transistors, the first transistor having a gate connected to the first node, the second transistor having a gate connected to the second node, a second output buffer unit (e.g., a second output buffer) including third and fourth transistors connected between a second voltage source having a second voltage and the third voltage source, and a second output node configured to connect the third and fourth transistors, the third and fourth transistors having gates connected to corresponding ones of the third and fourth nodes, respectively, the second output node being configured to output a voltage over a second voltage range between the second voltage and the third voltage, a charge share switch unit (e.g., a first switch) connected between the gate of the second transistor and the first voltage source, and a third output node configured to connect the first and second output nodes, wherein the first output buffer unit outputs a first output voltage over a first voltage range between the first voltage and the third voltage on the third output node in a first operation period, the second output buffer unit outputs a second output voltage over a second voltage range between the second voltage and the third voltage on the third output node in a second operation period, the charge share switch unit controls the second and third transistors and/or equilibrates a voltage at the third output node with the third voltage in a third operation period between the first operation period and the second operation period.

The charge share switch unit may include a first charge share switch unit (e.g., a first charge share switch) connected between the gate of the second transistor and the first voltage source, configured to control the second transistor and/or equilibrate the voltage at the first output node with the third voltage in response to a first control signal, and a second charge share switch unit (e.g., a second charge share switch) connected between the gate of the third transistor and the second voltage source, configured to control the third transistor and/or equilibrate a voltage at the second output node with the third voltage in response to a second control signal.

In another aspect of the invention, provided herein is a source driver including a latch unit configured to store data, a level shifter unit configured to convert a voltage level of data from the latch unit, a digital-to-analog converter unit configured to convert an output (e.g., a digital output) from the level shifter unit into an analog signal, and an output buffer configured to amplify the analog signal and to output the amplified analog signal, wherein the output buffer is the half-power buffer of any of the above-described embodiments.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1A:
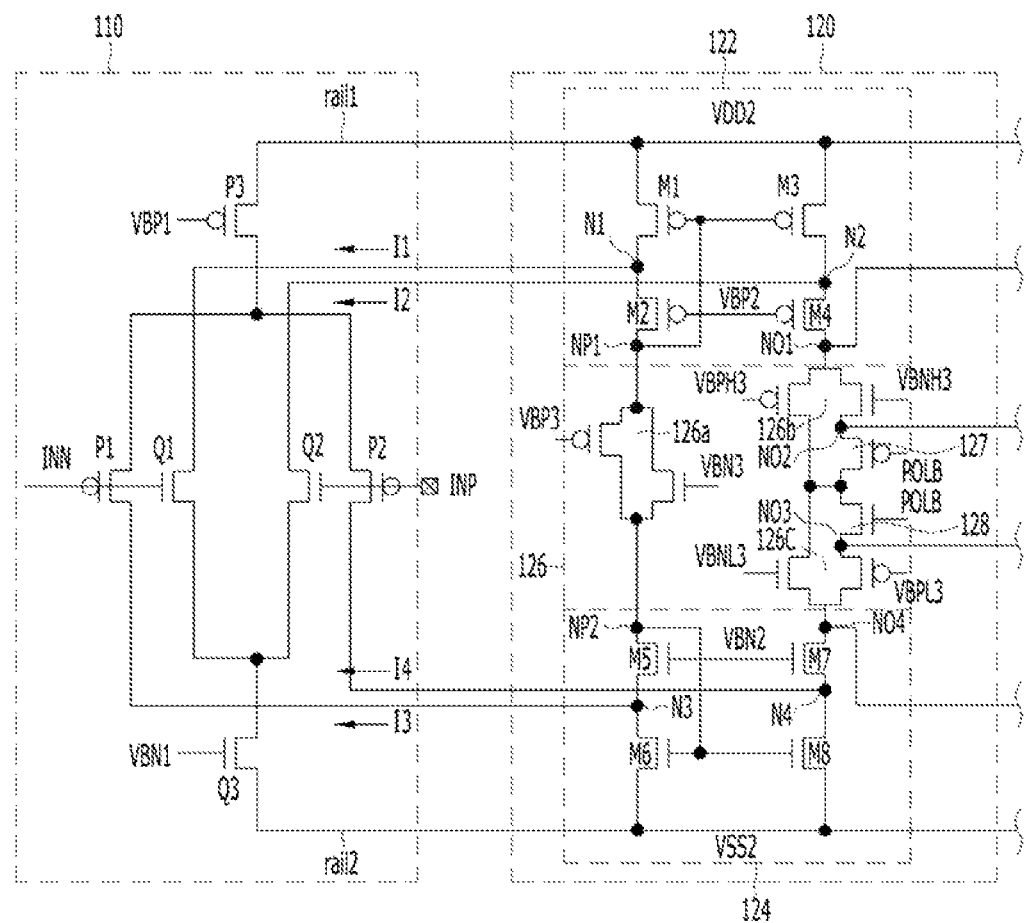
FIGS. 1A and 1B are circuit diagrams illustrating an exemplary half-power buffer and/or amplifier according to embodiments of the present disclosure.

Hereinafter, embodiments will be described in detail with reference to the annexed drawings for better understanding. In the following description of the embodiments, it will be understood that, when an element such as a layer or film, a region, a pattern, or a structure is referred to as being "on" or "under" another element, it can be directly on or under another element, or it can be indirectly on or under the other element with an intervening element present. In addition, terms such as "on" or "under" may be understood on the basis of the drawings.

In the drawings, dimensions of elements may be exaggerated, omitted or schematically illustrated for clarity and convenience of description. In addition, dimensions of constituent elements do not necessarily reflect actual dimensions thereof. The same reference numerals denote the same constituent elements.

Figure 1B:
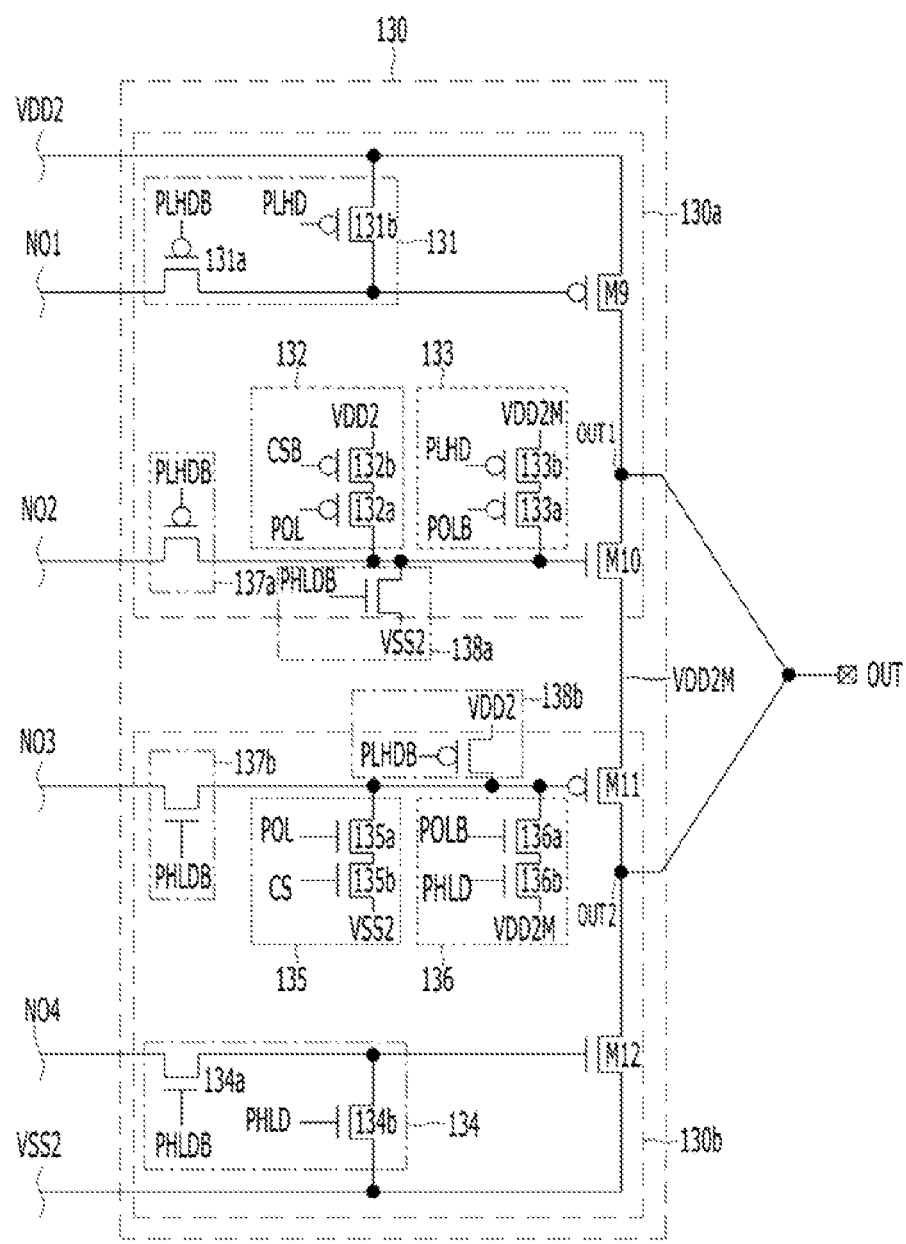

FIGS. 1A and 1B illustrate a half-power buffer and/or amplifier 100 according to embodiments of the present disclosure. The half-power buffer and/or amplifier 100 of FIGS. 1A and 1B may be applied to a source driver of a liquid crystal display device. Of course, embodiments of the present disclosure are not limited to such an application.

Referring to FIGS. 1A and 1B, the half-power buffer and/or amplifier 100 includes an input unit 110, an amplifying unit 120, and an output unit 130.

The half-power buffer and/or amplifier 100 may include a rail-to-rail amplifier. The amplifying unit (e.g., an amplifier) 120 may comprise a first amplifying block, whereas the second input unit 110b and second amplifying unit (e.g., the second amplifier) 120b may comprise first and second amplifying blocks.

The term "rail" may refer to a maximum or minimum supply voltage or power source (for example, VDD2 as a maximum voltage, and VSS2 as a minimum voltage). A "rail-to-rail amplifier" may be an operational amplifier configured to receive and/or provide a voltage over a full supply voltage range (for example, from VDD2 to VSS2). VDD or VDD2 may be, for example, 9 V, 5 V, 3.3 V, 2.5 V, 1.8 V, etc., and VSS or VSS2 may be a ground potential or 0 V. An input voltage or input voltage level may also be within the full range of the supply voltages.

The source driver of the liquid crystal display device may include at least one half-power buffer and/or amplifier 100 as illustrated in FIGS. 1A and 1B. The half-power buffer and/or amplifier 100 may output an output OUT to drive two adjacent channels of a display panel driven by the source driver. Here, "channel" may mean a data line of the source driver configured to drive pixels of the display panel.

The input unit 110 may be or comprise a complementary and/or differential amplifier. For example, the input unit 110 may include a folded cascode operational transconductance amplifier (OTA).

The input unit 110 may amplify the differential input signal INN/INP and may generate first to fourth differential currents (e.g., output currents) I1, I2, I3, and I4.

The input unit 110 may include a differential amplifier.

For example, the differential amplifier may include (i) first and second N-type transistors Q1 and Q2 having a common source configuration and (ii) a first bias unit Q3 connected to a second rail rail2, configured to control a bias current supplied to a common source of the first and second N-type transistors Q1 and Q2 in response to a first bias voltage VBN1.

The first bias unit Q3 may be implemented using an N-type transistor including (i) a gate configured to receive the first bias voltage VBN1 and (ii) source and drain terminals connected between the second rail rail2 and the common source of the first and second N-type transistors Q1 and Q2. The second rail rail2 may supply a second voltage (for example, VSS2).

For example, the differential amplifier may include (i) first and second P-type transistors P1 and P2 having a common source configuration and (ii) a second bias unit P3 connected to a first rail rail1 configured to control a bias current supplied to a common source of the first and second P-type transistors P1 and P2 in response to a second bias voltage VBP1. The second bias unit P3 may be or comprise a P-type transistor including (i) a gate configured to receive the second bias voltage VBP1 and (ii) source and drain terminals connected between the first rail rail1 and the common source of the first and second P-type transistors P1 and P2.

The first rail rail1 may supply a first supply voltage (for example, VDD2) higher than the second supply voltage VSS2.

A first input signal INN may be supplied to the gates of the first N-type transistor Q1 and first P-type transistor P1. A second or complementary input signal INP may be supplied to the gates of the second N-type transistor Q2 and second P-type transistor P2. Together, the input signals INN and INP constitute a differential input signal.

The drains of the first and second N-type transistors Q1 and Q2 may be connected to corresponding first and second nodes N1 and N2 of a first current mirror 122, which will be described later.

The drains of the first and second P-type transistors P1 and P2 may be connected to corresponding third and fourth nodes N3 and N4 of a second current mirror 124, which will be described later.

For example, the first current I1 (e.g., a first differential current) may be a current flowing between the drain of the first N-type transistor Q1 and the first node N1. The second differential current I2 (e.g., a second differential current)

may be a current flowing between the drain of the second N-type transistor Q2 and the second node N2. The third current I3 (e.g., a third differential current) may be a current flowing between the drain of the first P-type transistor P1 and the third node N3. The fourth differential current I4 (e.g., a fourth differential current) may be a current flowing between the drain of the second P-type transistor P2 and the fourth node N4.

The amplifying unit 120 may include the first current mirror 122, the second current mirror 124, and a third bias unit 126. Each of the first and second current mirrors 122 and 124 may comprise or be implemented using a cascode current mirror.

In the amplifying unit 120, the first current mirror 122 may include (i) first and second transistors M1 and M2 connected in series at the first node N1, configured to receive the first current I1, and (ii) third and fourth transistors M3 and M4 connected in series at the second node N2, configured to receive the second current I2. The second current mirror 124 may include (i) fifth and sixth transistors M5 and M6 connected in series at the third node N3, configured to receive the third current I3, and (ii) seventh and eighth transistors M7 and M8 connected in series at the fourth node N4, configured to receive the fourth current I4. The third bias unit 126 may be connected between the first current mirror 122 and the second mirror 124.

The first current mirror 122 controls a voltage at a first node NO1 in response to at least one of the first current I1, the second current I2 or a bias control voltage VBP2. In turn, the voltage at the first node NO1 controls a P-type transistor M9 of the first output unit 130a.

For example, in the first current mirror 122, the first and second transistors M1 and M2 may be connected at the first node N1, in series between the first supply voltage VDD2 and a first intermediate node NP1. The first node N1 is configured to receive the first current I1. In addition, the third transistor M3 is (i) connected between the first supply voltage VDD2 and the second node N2 and (ii) configured to receive the second current I2. The fourth transistor M4 is connected to the first node NO1.

The gates of the first and third transistors M1 and M3 may be connected, and the gates of the second and fourth transistors M2 and M4 may be connected. The gate of the first transistor M1 may be connected to the first intermediate node NP1.

In the first current mirror 122, the first and second transistors M1 and M2 may be connected in series between the first rail rail1 and the first intermediate node NP1. In addition, the third and fourth transistors M3 and M4 may be connected in series between the first rail rail1 and the first node NO1.

The gate of the first transistor M1 may be connected to the gate of the third transistor M3. The gate of the second transistor M2 may be connected to the gate of the fourth transistor M4. The gate of the first transistor M1 may be connected to the source or drain of the second transistor M2.

The second current mirror 124 controls a voltage at the fourth node NO4 in response to at least one of the third current I3, the fourth current I4 or a bias control voltage VBN2. In turn, the voltage at the fourth node NO4 controls an N-type transistor M12 of the second output unit 130b.

For example, in the second current mirror 124, the fifth and sixth transistors M5 and M6 may be connected at the third node N3 in series between the second supply voltage VSS2 and a second intermediate node NP2. The third node N3 is configured to receive the third current I3. In addition, the seventh transistor M7 is (i) connected between the second supply voltage VSS2 and the fourth node N4 and (ii) configured to receive the fourth current I4. The eighth transistor M8 is connected to the second node NO2.

The gates of the fifth and seventh transistors M5 and M7 may be connected and the gates of the sixth and eighth transistors M6 and M8 may be connected. The gate of the fifth transistor M5 may be connected to the second intermediate node NP2.

In the second current mirror 124, the fifth and sixth transistors M5 and M6 may be connected in series between the second rail rail2 and the second intermediate node NP2. In addition, the seventh and eighth transistors M7 and M8 may be connected in series between the second rail rail2 and the second node NO2.

The gate of the fifth transistor M5 may be connected to the gate of the seventh transistor M7. The gate of the sixth transistor M6 may be connected to the gate of the eighth transistor M8. The gate of the sixth transistor M6 may be connected to the source or drain of the fifth transistor M5.

The first intermediate node NP1 and first node NO1 may be connection nodes between the first current mirror 122 and the third bias unit 126, respectively. The second intermediate node NP2 and second node NO2 may be connection nodes between the second current mirror 124 and the third bias unit 126, respectively.

For example, the first intermediate node NP1 may be a connection node between the second transistor M2 and a first bias circuit 126a, whereas the first node NO1 may be a connection node between the fourth transistor M4 and a second bias circuit 126b. In addition, the second intermediate node NP2 may be a connection node between the fifth transistor M5 and the first bias circuit 126a, whereas the second node NO2 may be a connection node between the seventh transistor M7 and the third bias circuit 126c.

The first node N1 of the first current mirror 122 may be a connection node between the first and second transistors M1 and M2 connected in series, whereas the second node N2 of the first current mirror 122 may be a connection node between the third and fourth transistors M3 and M4 connected in series.

The third node N3 of the second current mirror 124 may be a connection node between the fifth and sixth transistors M5 and M6 connected in series, whereas the fourth node N4 of the second current mirror 124 may be a connection node between the seventh and eighth transistors M7 and M8 connected in series.

The third bias unit 126 may also be referred to as a "floating current source". The third bias unit 126 may include the first bias circuit 126a, the second bias circuit 126b, and/or the third bias circuit 126c.

The first bias circuit 126a may be connected between the second transistor M2 of the first current mirror 122 and the fifth transistor M5 of the second current mirror 124.

The second bias circuit 126b may be connected between the fourth transistor M4 of the first current mirror 122 and the third bias circuit 126c.

The third bias circuit 126c may be connected between the second current mirror 124 of the second bias circuit 126b and the eighth transistor M8 of the second current mirror 124.

The first bias circuit 126a may include an N-type transistor and a P-type transistor connected in parallel. The source and drain of each of the N-type transistor and P-type transistor in the first bias circuit 126a may be connected between the first intermediate node NP1 and the second intermediate node NP2.

Each gate of the N-type transistor and P-type transistor in the first bias circuit 126a may receive a corresponding one of first bias voltages VBN3 and VBP3.

The second bias circuit 126b may include an N-type transistor and a P-type transistor connected in parallel. The source and drain of each of the N-type transistor and P-type transistor in the second bias circuit 126b may be connected between the fourth transistor M4 of the first current mirror 122 and the second node NO2.

Each gate of the N-type transistor and P-type transistor in the second bias circuit 126b may receive a corresponding one of second bias voltages VBPH3 and VBNH3.

The third bias circuit 126c may include an N-type transistor and a P-type transistor connected in parallel. The source and drain of each of the N-type transistor and P-type transistor in the third bias circuit 126c may be connected between the seventh transistor M7 of the second current mirror 124 and the fourth node NO4.

Each gate of the N-type transistor and P-type transistor in the third bias circuit 126c may receive a corresponding one of third bias voltages VBPL3 and VBNL3.

Each of the first and second nodes NO1 and NO2 may be connected to a corresponding one of the ninth and tenth transistors M9 and M10 in the first output unit 130a.

Each of the third and fourth nodes NO3 and NO4 may be connected to a corresponding one of the eleventh and twelfth transistors M11 and M12 in the second output unit 130b.

The output unit 130 may include the first output subunit 130a and the second output subunit 130b.

The first output subunit 130a may output a voltage over a first voltage range (for example, from VDD2M to VDD2), and may be referred to as a "positive output unit".

The second output subunit 130b may output a voltage over a second voltage range (for example, from VSS2 to VDD2M), and may be referred to as a "negative output unit".

The first output subunit 130a may include a (i) first output buffer unit connected between a first voltage source having a first voltage VDD2 and a third voltage source having a third voltage VDD2M, (ii) a first switch unit (e.g., a switch) including a switch subunit 131 and a switch 138a, (iii) a second switch unit including a switch subunit 132 and a switch 137a, and (iv) a third switch unit 133.

The first output buffer unit (e.g., a first output buffer) may include (i) the transistors M9 and M10 connected between the first voltage source having the first voltage VDD2 (hereinafter, simply referred to as the "first voltage source VDD2") and the third voltage source having the third voltage VDD2M (hereinafter, simply referred to as the "third voltage source VDD2M") and (ii) the first output node OUT1, which may be configured to connect the transistors M9 and M10.

The second output subunit 130b may include (i) a second output buffer unit connected between the third voltage source VDD2M and a second voltage source having a second voltage VSS2 (hereinafter, simply referred to as the "second voltage source VSS2"), (ii) a fourth switch unit including switches 134 and 138b, (iii) a fifth switch unit including switches 135 and 137b, and (iv) a sixth switch unit 136.

The second output buffer unit may include (i) the transistors M11 and M12 connected between the second voltage source VSS2 and the third voltage source VDD2M and (ii) the second output node OUT2 configured to connect the transistors M11 and M12.

The third voltage VDD2M may be supplied to the connection node between the first output buffer unit and the second output buffer unit. For example, the connection node between the transistor M10 of the first output buffer unit and the transistor M11 of the second output buffer unit may be connected to the third voltage source VDD2M.

The first output node OUT1 and second output node OUT2 may be connected. The node configured to connect the first output node OUT1 and second output node OUT2 may be or comprise the output node OUT of the output unit 130. Of course, embodiments are not limited to such a configuration. In another or alternative embodiment, the output unit 130 may include first and second output nodes separate from each other.

One of the first and second output units 130a and 130b may be selectively turned on, and the other of the first and second output units 130a and 130b may be selectively turned off using the first switch unit 131-138a and/or fourth switch unit 134-138b, respectively.

For example, the first switch unit 131-138a and fourth switch unit 134-138b may be selectively turned on or off in response to first to fourth signals PHLD, PHLDB, PLHD, and PLHDB.

The first switch unit 131-138a may include switches 131a, 131b and 138a. The first switch unit may be or comprise a first output switch unit (e.g., a first output switch).

The switch 131a may be connected between the first node NO1 and the gate of the transistor M9, and may be turned on or off in response to the fourth signal PLHDB.

The switch 131b may be connected between the first voltage source VDD2 and the gate of the transistor M9 and may be turned on or off in response to the third signal PLHD.

The switch 138a may be connected between the gate of the transistor M10 and the second voltage source VSS2 and may be turned on or off in response to the second signal PHLDB.

The fourth switch unit 134-138b may include switches 134a, 134b and 138b. The fourth switch unit may be a second output switch unit (e.g., a second output switch).

The switch 134a may be connected between the fourth node NO4 and the gate of the transistor M12 and may be turned on or off in response to the second signal PHLDB.

The switch 134b may be connected between the second voltage source VSS2 and the gate of the transistor M12 and may be turned on or off in response to the first signal PHLD.

The switch 138b may be connected between the gate of the transistor M11 and the first voltage source VDD2 and may be turned on or off in response to the fourth signal PLHDB.

The second switch unit 132-137a and fifth switch unit 135-137b may (i) decrease the voltage at the output node OUT1 of the first output unit 130a from the first voltage VDD2 to the third voltage VDD2M or (ii) increase the voltage at the output node OUT1 from the second voltage VSS2 to the third voltage VDD2M. This operation may be referred to as a charge share operation (e.g., an equilibration operation). In this regard, the switch unit 132 may comprise a first charge share switch unit and the switch unit 135 may be a second charge share switch unit. A charge share switch unit (e.g., equilibration switch) may comprise the first charge share switch subunit and the second charge share switch subunit. In this case, the charge share switch unit may control the second transistor and the third transistor in a third operation period between a first operation period and a second operation period to control the voltage at a third output node and/or equilibrate the voltage at the third output node at or with the second voltage.

For example, the second switch unit 132-137a may decrease the voltage at the output node OUT1 of the first output buffer unit from the first voltage VDD2 to the third voltage VDD2M in response to a first control signal. In this case, the first control signal may include a first polarity control signal "POL," a second charge share control signal CSB, and the fourth signal PLHDB. That is, the first charge share switch subunit may perform a first charge share operation (e.g., a first equilibration operation) to control the second transistor in response to the first control signal (POL, CSB and PLHDB) and/or equilibrate the voltage at the first output node with the third voltage VDD2M.

For example, the fifth switch unit 135-137b may increase the voltage at the second output node OUT2 of the second output buffer unit from the second voltage VSS2 to the third voltage VDD2M in response to a second control signal. In this case, the second control signal may include the first polarity control signal POL, a first charge share control signal (e.g., a first equilibration control signal) CS, and a second signal PHLDB. That is, the second charge share switch subunit may perform a second charge share operation to control the third transistor in response to the second control signal (POL, CS and PHLDB), and/or equilibrate the voltage at the second output node with the third voltage VDD2M.

The switch 137a may electrically disconnect or float the output unit 130 from the amplifying unit 120 in response to a third control signal, in the first charge share operation. The third control signal may include the fourth signal PLHDB.

The switch 137b may electrically disconnect or float the output unit 130 from the amplifying unit 120 in response to a fourth control signal, in the second charge share operation. The fourth control signal may include the second signal PHLDB.

The second switch subunit 132-137a may include switches 132a, 132b and 137a.

The switch 132a and switch 137a may be connected in series between the gate of the transistor M10 and the first voltage source VDD2. The switch 132a may be turned on or off in response to the first polarity control signal POL. The switch 132b may be turned on or off in response to the second charge share signal CSB.

For example, the switch 132a and the switch 132b may include transistors having the same polarity, for example, P-type transistors. Of course, embodiments are not limited to such a configuration. In another embodiment, the switch 132a and switch 132b may include N-type transistors. In another embodiment, the switch 132a and the switch 132b may include transistors having different polarities.

The switch 137a may be connected between the second node NO2 and the gate of the transistor M10, and may be turned on or off in response to the fourth signal PLHDB.

The fifth switch unit 135-137b may include switches 135a, 135b and 137b.

The switch 135a and the switch 135b may be connected in series between the gate of the transistor M11 and the second voltage source VSS2. The switch 135a may be turned on or off in response to the first polarity control signal POL. The switch 135b may be turned on or off in response to the first charge share signal (e.g., the first equilibration signal) CS.

For example, the switch 135a and the switch 135b may include transistors having the same polarity, for example, N-type transistors. Of course, embodiments are not limited to such a configuration. In another embodiment, the switch 135a and the switch 135b may include P-type transistors. In yet another embodiment, the switch 135a and the switch 135b may include transistors having different polarities.

The switch 137b may be connected between the third node NO3 and the gate of the transistor M11 and may be turned on or off in response to the second signal PHLDB.

The third switch unit 133 and the sixth switch unit 136 may reset corresponding output nodes of the output node 130 to the third voltage VDD2M, thus reducing an abnormal output period that may occur during dot inversion.

In this regard, the third switch unit 133 may comprise a first reset switch unit. The first reset switch unit may reset the first output node of the first output buffer unit to the second voltage in response to a first reset control signal. The first reset control signal may include a second polarity control signal POLB and the third signal PLHD. The third signal PLHD may be referred to as a fifth control signal.

The sixth switch unit 136 may comprise a second reset switch unit (e.g., a second reset switch). The second reset switch unit may reset the second output node of the second output buffer unit to the second voltage in response to a second reset control signal. The second reset control signal may include the second polarity control signal POLB and the first signal PHLD. The first signal PHLD may be referred to as a sixth control signal.

For example, the third and sixth switches 133 and 136 may be selectively turned on or off in response to the first signal PHLD, third signal PLHD and second polarity control signal POLB.

The third switch unit 133 may include switches 133a and 133b.

The switch 133a and the switch 133b may be connected in series between the gate of the transistor M10 and the third voltage source VDD2M. The switch 133a may be turned on or off in response to the second polarity control signal POLB. The switch 133b may be turned on or off in response to the third signal PLHD.

For example, the switch 133a and the switch 133b may include transistors having the same polarity, for example, P-type transistors. Of course, embodiments are not limited to such a configuration. In another embodiment, the switch 133a and the switch 133b may include N-type transistors. In another embodiment, the switch 133a and the switch 133b may include transistors having different polarities.

The sixth switch unit 136 may include switches 136a and 136b.

The switch 136a and the switch 136b may be connected in series between the gate of the transistor M11 and the third voltage source VDD2M. The switch 136a may be turned on or off in response to the second polarity control signal POLB. The switch 136b may be turned on or off in response to the first signal PHLD.

For example, the switch 136a and the switch 136b may include transistors having the same polarity, for example, N-type transistors. Of course, embodiments are not limited to such a configuration. In another or alternative embodiment, the switch 136a and the switch 136b may include P-type transistors. In yet another embodiment, the switch 136a and the switch 136b may include transistors having different polarities.

As shown in FIGS. 1A and 1B, the first to sixth switches may include N-type transistors and/or P-type transistors. Of course, embodiments are not limited to such a configuration. The first to sixth switches may include transistors having polarities opposite to those of the above-described transistors.

Figure 2:
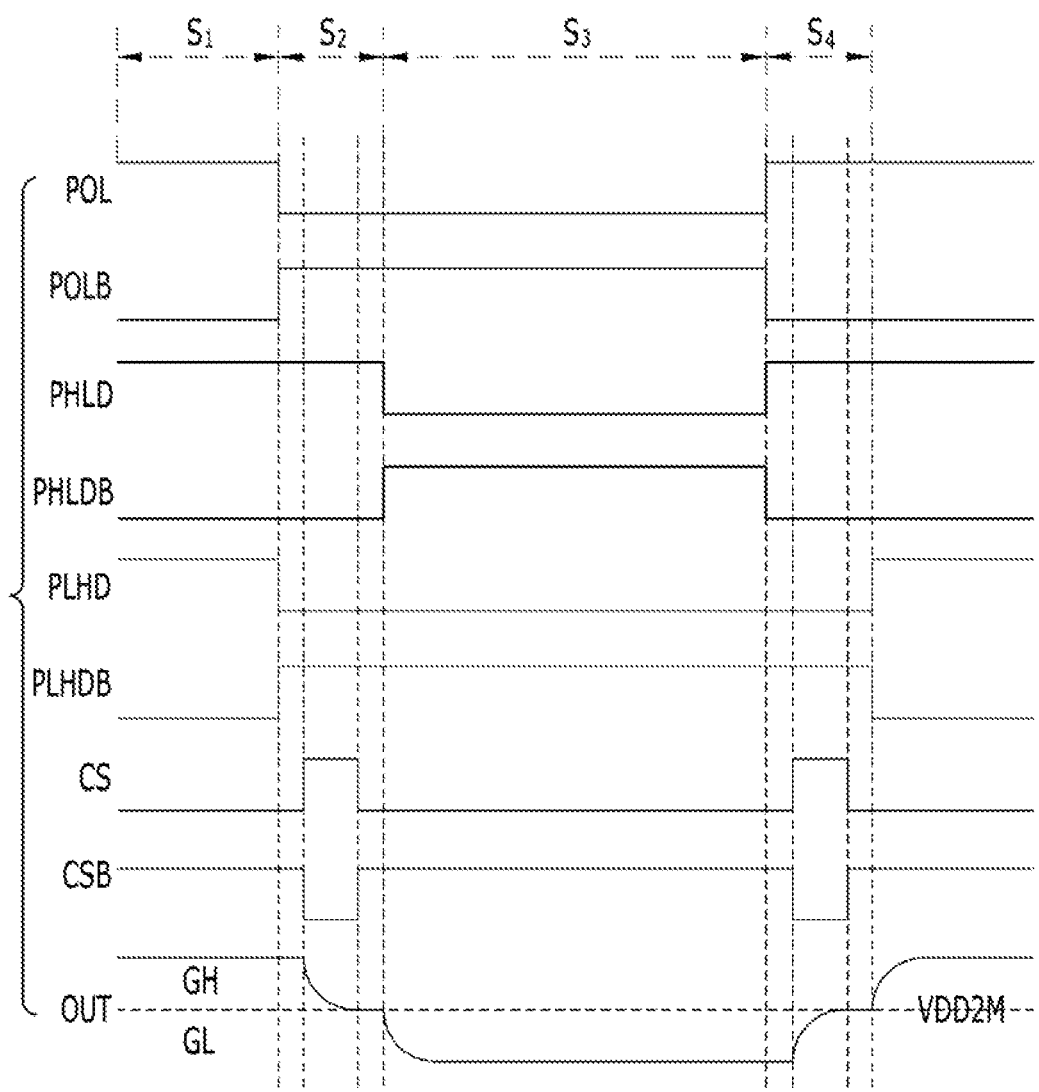
FIG. 2 is a waveform diagram of exemplary outputs of first and second output units according to selective connection performed in response to polarity control signals according to one or more embodiments of the present disclosure.

FIG. 2 is a timing diagram of the first and second polarity control signals POL and POLB, the first to fourth signals PHLD, PHLDB, PLHD and PLHDB, the first and second charge share control signals (e.g., equilibration control signals) CS and CSB, and the output signal OUT.

Referring to FIG. 2, the POL signals may be polarity control signals, and the first and third signals PHLD and PLHD may be signals having non-overlapping periods in a charge share operation (e.g., an equilibration operation). The second polarity control signal POLB is an inverted first polarity control signal POL. The second signal PHLDB is an inverted first signal PHLD. The fourth signal PLHDB is an inverted third signal PLHD.

Hereinafter, a first operation (positive operation) S1 of the half-power buffer and/or amplifier 100 will be described with reference to FIG. 2.

In the first operation, the first polarity control signal POL, first signal PHLD, third signal PLHD and second charge share control signal CSB may have a first level (for example, a high digital logic level, such as a binary "1"), and the second polarity control signal POLB, second signal PHLDB, fourth signal PLHDB and first charge share control signal CS may have a second level (for example, a low digital logic level, such as a binary "0").

In the first operation, the switch unit 132, switch unit 133, fifth switch unit 135-137b and sixth switch unit 136 turn off.

In the first operation, the switch 131a of the first switch unit may turn on and the switch 131b may turn off. In this case, the gate of the transistor M9 may be connected to the first node NO1.

In the first operation, the switch 138a of the first switch unit may turn off and the switch 137a of the second switch unit may turn on. In this case, the gate of the transistor M10 may be connected to the second node NO2.

In the first operation, the switch 134a of the fourth switch unit may turn off and the switch 134b may turn on. In this case, the gate of the transistor M12 may be connected to the second voltage source VSS2. Accordingly, the transistor M12 may turn off.

In the first operation, the switch 138b may turn on. In this case, the gate of the transistor M11 may be connected to the first voltage source VDD2. Accordingly, the transistor M11 may turn off.

In the first operation, the first output buffer unit (e.g., the first output buffer) of the first output unit 130a may be controlled by output voltages of the first and second nodes NO1 and NO2 of the amplifying unit 120, to output a voltage over a first voltage range from VDD2M to VDD2. In this case, the second output unit 130b may turn off.

Next, a second operation (e.g., a first charge share operation) S2 of the half-power buffer and/or amplifier 100 will be described.

This charge share operation may be performed after the level and/or first polarity of the first polarity control signal POL changes from the first level (e.g., the high digital logic level) to the second level (e.g., the low digital logic level), for dot inversion.

In the second operation, (i) the second polarity control signal POLB, first signal PHLD, fourth signal PLHDB and first charge share control signal CS may have the first level, and (ii) the first polarity control signal POL, second signal PHLDB, third signal PLHD and second charge share control signal CSB may have the second level.

In the second operation, the third switch unit 133, fifth switch 135 and sixth switch 136 may turn off.

In the second operation, the switch 131a of the first switch unit may turn off, the switch 131b may turn on, and the switch 138a may turn off. In this case, the gate of the transistor M9 may be connected to the first voltage source VDD2. Accordingly, the transistor M9 may turn off.

In the second operation, the switch 137a of the second switch unit may turn off. In this case, the gate of the transistor M10 may be electrically disconnected from the second node NO2 of the amplifying unit 120.

In the second operation, the switches 132a and 132b of the second switch unit may turn on. In this case, the gate of the transistor M10 is connected to the first voltage source VDD2. Accordingly, the transistor M10 may turn on.

In the second operation, since the transistor M9 of the first output buffer unit may turn off, and the transistor M10 may turn on, the voltage at the first output node OUT1 of the first output buffer unit may decrease from the first voltage VDD2 to the third voltage VDD2M.

In this case, the second output unit 130b of the half-power buffer and/or amplifier 100 may perform a second reset operation included in the first charge share operation.

In the second reset operation, the switch 134a of the fourth switch unit may turn off and the switch 134b may turn on. In this case, the gate of the transistor M12 may be connected to the second voltage source VSS2. Accordingly, the transistor M12 may turn off.

In this case, the third voltage VDD2M may be loaded or received at the second output node OUT2 of the second output unit 130b in the half-power buffer and/or amplifier 100.

In the second operation, the switch 138b of the fourth switch unit may turn off, the switch 137b of the fifth switch unit may turn off, the switch 135a may turn off, and the switch 135b may turn on.

In the second operation, the switches 136a and 136b of the sixth switch unit may turn on. In this case, the gate of the transistor M11 may be connected to the third voltage source VDD2M. Accordingly, the transistor M11 may be reset. Thus, the second reset switch unit 137 may reset the first output node of the second output buffer unit to the third voltage VDD2M in the first charge share operation.

Next, a third operation (negative operation) S3 of the half-power buffer and/or amplifier 100 will be described.

In the third operation, the second polarity control signal POLB, second signal PHLDB, fourth signal PLHDB and second charge share control signal CSB may have the first level, and the first polarity control signal POL, first signal PHLD, third signal PLHD and first charge share control signal CS may have the second level.

In the third operation, the switch 134a of the fourth switch unit may turn on, the switch 134b may turn off, and the switch 138b may turn off. In this case, the gate of the twelfth transistor M12 may be connected to the fourth output buffer NO4.

In the third operation, the switch 135a of the fifth switch unit may turn off, the switch 135b may turn off, and the switch 137b may turn off. In addition, the switch 136a of the sixth switch unit may turn on and the switch 136b may turn off. In this case, the gate of the eleventh transistor M11 may be connected to the third node NO3.

Accordingly, the second output unit 130b may be controlled by the amplifying unit 120 to output a voltage over the second voltage range.

The first switch 131a of the first switch unit may turn off and the second switch 131b may turn on. In this case, the gate of the ninth transistor M9 may be connected to the first voltage source VDD2.

The third switch 138a may turn on. In this case, the gate of the tenth transistor M10 may be connected to the second voltage source VSS2.

The switch 132a of the second switch unit may turn on, the switch 132a may turn off, and the switch 137a may turn on.

The switch 133a of the third switch unit may turn off and the switch 133b may turn on. Accordingly, the first output unit 130a may turn off.

Next, a fourth operation (e.g., a second charge share operation) S4 of the half-power buffer and/or amplifier 100 will be described.

For dot inversion, this charge share operation may be performed after the level and/or first polarity of the first polarity control signal POL changes from the second level (e.g., a low digital logic level) to the first level (e.g., a high digital logic level).

In the fourth operation, the first polarity control signal POL, first signal PHLD, fourth signal PLHDB and first charge share control signal CS may have the first level, and the second polarity control signal POLB, second signal PHLDB, third signal PLHD and second charge share control signal CSB may have the second level.

In the fourth operation, the switch unit 132 and sixth switch unit 136 may turn off.

In the fourth operation, the switch 134a of the fourth switch unit may turn off, the switch 131b may turn on, and the switch 138b may turn off. In this case, the gate of the transistor M9 may be connected to the first voltage source VDD2. Accordingly, the transistor M9 may turn on.

In the fourth operation, the switch 137b may turn off. Accordingly, the gate of the transistor M11 may be electrically disconnected from the third node NO3 of the amplifying unit 120.

In the fourth operation, the switches 135a and 135b of the fifth switch unit may turn on. In this case, the gate of the transistor M11 may be connected to the second voltage source VSS2. Accordingly, the transistor M11 may turn on.

In the fourth operation, since the transistor M12 of the second output buffer unit may turn off and the transistor M11 may turn on, the voltage of the second output node OUT2 may increase from the second voltage VSS2 to the third voltage VDD2M.

In this case, the first output unit 130a of the half-power buffer and/or amplifier 100 may perform a first reset operation during the second charge share operation.

In the reset operation, the switch 131a of the first switch unit may turn off, and the switch 131b may turn on. In this case, the gate of the transistor M9 is connected to the first voltage source VDD2. Accordingly, the transistor M9 of the first output buffer unit may turn off.

In this case, the third voltage VDD2M may be loaded or received at the first output node OUT1 of the first output unit 130a in the half-power buffer and/or amplifier 100.

In the first reset operation, the switch 138a of the first switch unit may turn off, the switch 137a of the second switch unit may turn off, the switch 132a may turn off, and the switch 132b may turn on.

In the first reset operation, the switches 133a and 133b of the third switch unit may turn on. In this case, the gate of the transistor M10 may be connected to the third voltage source VDD2M. Accordingly, the transistor M10 may be reset.

Thus, the third switch unit 133 (e.g., the first reset switch unit) may reset the second output node of the second output buffer unit to the third voltage VDD2M in the second charge share operation.

As described above, embodiments provide a configuration enabling dot inversion by use of half power. In addition, various embodiments may achieve low-power design and small-area design by use of half power because the input unit 110, amplifying unit 120, and first and second output units 130a and 130b may be driven using a half-power voltage.

Figure 3:
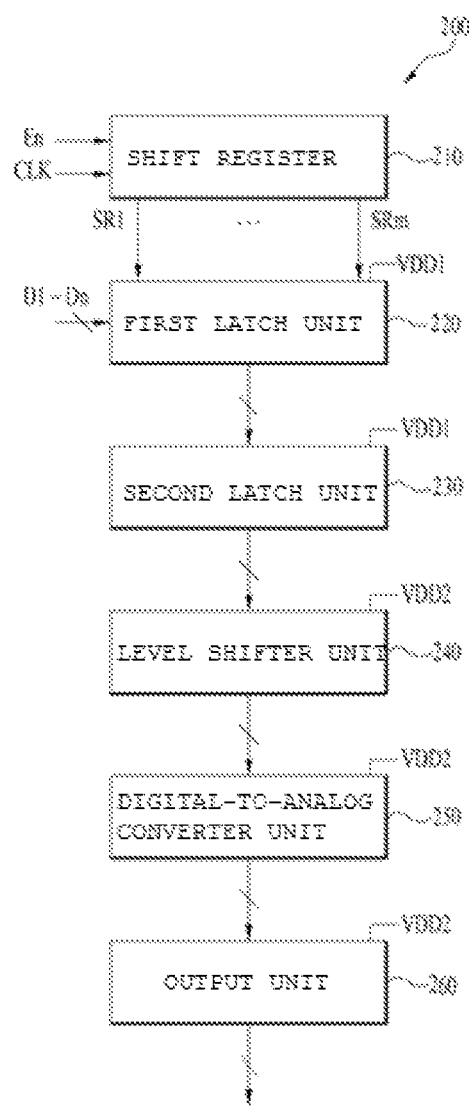
FIG. 3 is a block diagram of a general source driver.
Figure 4:
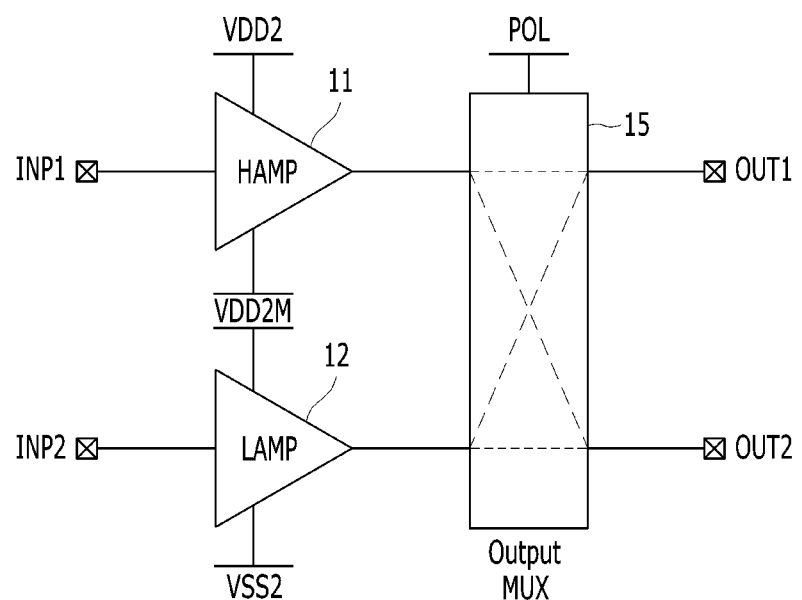
FIG. 4 is a circuit diagram of a general half-power output buffer.

FIG. 3 shows a block diagram of a source driver 200 according to one or more embodiments of the present disclosure.

Referring to FIG. 3, the source driver 200 includes a shift register 210, a first latch unit 220, a second latch unit 230, a level shifter unit 240, a digital-to-analog converter unit 250, and an output unit 260.

The shift register 210 generates shift signals SR1 to SRm (m being a natural number greater than 1) in response to an enable signal En and a clock signal CLK to control storage timing of serial data (e.g., digital image data) stored in the first latch unit 220.

For example, the shift register 210 may receive a horizontal start signal from a timing controller (not shown), and may shift the received horizontal start signal in response to the clock signal CLK and, as such, may generate the shift signals SR1 to SRm (m being a natural number greater than 1). The horizontal start signal may be used together with a start pulse.

The first latch unit 220 stores data D1 to Dn (n being a natural number greater than 1) received from the timing controller (not shown) in response to the shift signals SR1 to SRm (m being a natural number greater than 1) from the shift register 210, respectively.

The first latch unit 220 may include a plurality of first latches (not shown). The first latches may store data D1 to Dn (n being a natural number greater than 1).

For example, the data received from the timing controller may be red (R), green (G), or blue (B) data. Thus, the first latches of the first latch unit 220 may store R, G, and B data.

That is, the data D1 to Dn (n being a natural number greater than 1) received from the timing controller may be sequentially stored in the first latches in the first latch unit 220 in response to the shift signals SR1 to SRm (m being a natural number greater than 1).

The second latch unit 230 stores data from the first latch unit 220 in response to a control signal from the timing controller.

For example, the second latch unit 230 may store the data output from the first latch unit 220 on a horizontal line period basis.

For example, one horizontal line period may be the period to completely store data corresponding to one horizontal line of a display panel in the first latches of the first latch unit 220.

For example, one horizontal line period may be a period between a first time and a second time.

The first time may be a time when data stored in the first latch unit 220 is output as a first analog signal via the level shifter unit 240 and the digital-to-analog converter unit 250 after being transferred to the second latch 230 in response to a horizontal line signal. The second time may be a time when the data stored in the first latch unit 220 is output as a second analog signal via the level shifter unit 240 and the digital-to-analog converter unit 250 after being transferred to the second latch 230 in response to a next or subsequent horizontal line signal.

Alternatively, for example, one horizontal line period may mean one period of horizontal line signals.

The second latch unit 230 may include a plurality of second latches. The number of the second latches may be equal to the number of the first latches.

The level shifter unit 240 shifts the voltage level of the data from the second latch unit 230. For example, the level shifter unit 240 may shift the voltage level of data having a first-level voltage to a second-level voltage.

For example, the drive voltage of the level shifter unit 140, namely, a drive voltage VDD2, may be higher than a drive voltage VDD1 of the first latch unit 220 and the second latch unit 230.

For example, the level shifter unit 240 may include a plurality of level shifters. The number of the level shifters may be equal to the number of the first latches and/or the number of the second latches. Of course, embodiments are not limited to such configurations.

The digital-to-analog converter unit 250 converts an output from the level shifter unit 240, namely, digital data, into an analog signal.

For example, the digital-to-analog converter unit 250 may be configured to receive grayscale voltages from a power supply (not shown), and convert the digital output from the level shifter unit 240 into an analog signal using the grayscale voltages (e.g., according to a corresponding grayscale voltage).

For example, the power supply (not shown) may comprise and/or be implemented using a plurality of resistors connected in series between a supply voltage VDD2 and a ground voltage GND and, as such, may generate multi-level grayscale voltages (e.g., 256-level grayscale voltages).

The output unit 260 amplifies (or buffers) the analog signal output from the digital-to-analog converter unit 250, and outputs the amplified (or buffered) analog signal.

The output unit 260 may include a plurality of amplifiers and/or a plurality of buffers.

As is apparent from the above description, in accordance with various embodiments, it may be possible to prevent an abnormal output during polarity inversion and to achieve a low-power and/or small-area design using a half-power approach.

Embodiments as described above may include particular features, structures, or characteristics, but not every embodiment necessarily includes the particular features, structures, or characteristics. Furthermore, the particular features, structures or characteristics in each embodiment may be combined in any suitable manner, as would be apparent to one of ordinary skill in the art from this disclosure, with one or more other embodiments. Therefore, combinations of features of different embodiments are meant to be within the scope of the invention.

What is claimed is:

1. A half-power buffer and/or amplifier comprising:
an amplifying unit configured to amplify a differential input signal, the amplifying unit comprising first to fourth nodes configured to output first to fourth amplified outputs;
a first output buffer unit comprising (i) first and second transistors connected between a first voltage source having a first voltage and a third voltage source having a third voltage, and (ii) a first output node configured to connect the first and second transistors, the first and second transistors having gates connected to corresponding ones of the first and second nodes, respectively, the first output node being configured to output a voltage over a first voltage range between the first voltage and the third voltage;
a second output buffer unit comprising (i) third and fourth transistors connected between a second voltage source having a second voltage and the third voltage source, and (ii) a second output node configured to connect the third and fourth transistors, the third and fourth transistors having gates connected to corresponding ones of the third and fourth nodes, respectively, the second output node being configured to output a voltage over a second voltage range between the second voltage and the third voltage;
a third output node configured to connect the first output node of the first output buffer unit and the second output node of the second output buffer unit;
a first charge share switch unit connected between the gate of the second transistor and the first voltage source, and configured to control the second transistor and/or equilibrate a voltage at the first output node with the third voltage in response to a first control signal; and
a first output switch unit comprising a seventh switch (i) connected between the first node and the gate of the first transistor and (ii) configured to receive a third control signal, an eighth switch (iii) connected between the second voltage source and the gate of the second transistor and (iv) configured to receive a fourth control signal, and a ninth switch (v) connected between the first voltage source and the gate of the first transistor and (vi) configured to receive a fifth control signal, wherein:
the first charge share switch unit comprises first and second switches connected between the first voltage source and the gate of the second transistor,
the first and second switches provide the first voltage to the gate of the second transistor in response to the first control signal, and
the eighth switch provides the second voltage to the gate of the second transistor in response to the fourth control signal.

2. The half-power buffer and/or amplifier according to claim 1, further comprising:
a second charge share switch unit connected between the gate of the third transistor and the second voltage source, and configured to control the third transistor and/or equilibrate a voltage at the second output node with the third voltage in response to a second control signal, wherein:
the second charge share switch unit comprises fourth and fifth switches connected between the second voltage source and the gate of the third transistor, and
the fourth and fifth switches provide the second voltage of the second voltage source to the gate of the third transistor in response to the second control signal.

3. The half-power buffer and/or amplifier according to claim 1, wherein the first voltage is higher than the third voltage, and the second voltage is lower than the third voltage.

4. The half-power buffer and/or amplifier according to claim 2, wherein:
the first switch is configured to receive a first polarity control signal, and the second switch is configured to receive a first charge share signal.

5. The half-power buffer and/or amplifier according to claim 4, wherein the first charge share switch unit further comprises a third switch connected between the second node and the gate of the second transistor, configured to float or electrically disconnect the first output buffer unit from the second node in response to the third control signal.

6. The half-power buffer and/or amplifier according to claim 4, further comprising:
a first reset switch unit connected between the gate of the second transistor and the third voltage source, configured to reset the first output node of the first output buffer unit to the third voltage in response to a first reset control signal, wherein the first reset switch unit provides the third voltage to the gate of the second transistor in response to the first reset control signal.

7. The half-power buffer and/or amplifier according to claim 6, wherein the first reset switch unit resets the first output node of the first output buffer unit to the third voltage when equilibrating the second output node with the third voltage.

8. The half-power buffer and/or amplifier according to claim 5, wherein:
the fourth switch is configured to receive the first polarity control signal, and the fifth switch is configured to receive a second charge share signal.

9. The half-power buffer and/or amplifier according to claim 8, wherein the second charge share switch unit further comprises a sixth switch connected to the third node and the gate of the third transistor, and is configured to float or electrically disconnect the second output buffer unit from the third node in response to the fourth control signal.

10. The half-power buffer and/or amplifier according to claim 6, further comprising:
a second reset switch unit connected between the gate of the third transistor and the third voltage source, configured to reset the second output node of the second output buffer unit to the third voltage in response to a second reset control signal, wherein the second reset switch unit provides the third voltage to the gate of the third transistor in response to the second reset control signal.

11. The half-power buffer and/or amplifier according to claim 10, wherein the second reset switch unit resets the second output node of the second output buffer unit to the third voltage when equilibrating the first output node with the third voltage.

12. The half-power buffer and/or amplifier according to claim 1, further comprising: a second output switch unit comprising (i) a tenth switch connected between the fourth node and the gate of the fourth transistor and (ii) configured to receive the fourth control signal, an eleventh switch (iii) connected between the first voltage source and the gate of the third transistor and (iv) configured to receive the third control signal, and a twelfth switch (v) connected between the second voltage source and the gate of the fourth transistor and (vi) configured to receive a sixth control signal, wherein the eleventh switch provides the first voltage of the first voltage source to the gate of the third transistor in response to the third control signal.

13. The half-power buffer and/or amplifier according to claim 12, wherein:
the first reset switch unit comprises thirteenth and fourteenth switches connected between the gate of the second transistor and the third voltage source; and
the thirteenth switch is configured to receive the fifth control signal, and the fourteenth switch is configured to receive a second polarity control signal.

14. The half-power buffer and/or amplifier according to claim 13, further comprising:
a fifteenth switch (i) connected between the gate of the third transistor and the third voltage source and (ii) configured to receive the sixth control signal; and
a sixteenth switch (i) connected between the gate of the third transistor and the third voltage source and (ii) configured to receive the second polarity control signal.

15. The half-power buffer and/or amplifier according to claim 13, wherein the second polarity control signal is an inverted first polarity control signal.

16. A half-power buffer and/or amplifier comprising:
an amplifying unit configured to amplify a differential input signal, the amplifying unit comprising first to fourth nodes configured to output first to fourth outputs;
a first output buffer unit comprising first and second transistors connected between a first voltage source having a first voltage and a third voltage source having a third voltage, and a first output node configured to connect the first and second transistors, the first transistor having a gate connected to the first node, the second transistor having a gate connected to the second node;
a second output buffer unit comprising third and fourth transistors connected between a second voltage source having a second voltage and the third voltage source, and a second output node configured to connect the third and fourth transistors, the third and fourth transistors having gates connected to corresponding ones of the third and fourth nodes, respectively, the second output node being configured to output a voltage over a second voltage range between the second voltage and the third voltage;
a first charge share switch unit connected between the gate of the second transistor and the first voltage source;
a first output switch unit comprising a seventh switch (i) connected between the first node and the gate of the first transistor and (ii) configured to receive a third control signal, an eighth switch (iii) connected between the second voltage source and the gate of the second transistor and (iv) configured to receive a fourth control signal, and a ninth switch (v) connected between the first voltage source and the gate of the first transistor and (vi) configured to receive a fifth control signal;
a second charge share switch unit connected between the gate of the third transistor and the second voltage source;
a second output switch unit comprising (i) a tenth switch connected between the fourth node and the gate of the fourth transistor and (ii) configured to receive the fourth control signal, an eleventh switch (iii) connected between the first voltage source and the gate of the third transistor and (iv) configured to receive the third control signal, and a twelfth switch (v) connected between the second voltage source and the gate of the fourth transistor and (vi) configured to receive a sixth control signal; and
a third output node configured to connect the first and second output nodes,
wherein:
the first output buffer unit outputs a first output voltage over a first voltage range between the first voltage and the third voltage on the third output node in a first operation period;
the second output buffer unit outputs a voltage over a second voltage range between the second voltage and the third voltage on the third output node in a second operation period;
the first and second charge share switch units control the second and third transistors and/or equilibrate a voltage at the third output node with the third voltage in a third operation period between the first operation period and the second operation period,
the first charge share switch unit comprises first and second switches connected between the first voltage source and the gate of the second transistor and a third switch connected between the second node and the gate of the second transistor, the second charge share switch unit comprises fourth and fifth switches connected between the second voltage source and the gate of the third transistor, the first and second switches provide the first voltage of the first voltage source to the gate of the second transistor in response to the first control signal, the fourth and fifth switches provide the second voltage of the second voltage source to the gate of the third transistor in response to the first control signal, the eighth switch provides the second voltage of the second voltage source to the gate of the second transistor in response to the fourth control signal, and the eleventh switch provides the first voltage of the first voltage source to the gate of the third transistor in response to the third control signal.

17. The half-power buffer and/or amplifier according to claim 16, wherein the charge share switch unit comprises:

a first charge share switch connected between the gate of the second transistor and the first voltage source, configured to control the second transistor and/or equilibrate a voltage at the first output node with the third voltage in response to the first control signal; and a second charge share switch connected between the gate of the third transistor and the second voltage source, configured to control the third transistor and/or equilibrate a voltage at the second output node with the third voltage in response to a second control signal.

18. A source driver comprising;

a latch unit configured to store data;

a level shifter unit configured to convert a voltage level of data from the latch unit;

a digital-to-analog converter unit configured to convert an output from the level shifter unit into an analog signal; and an output buffer configured to amplify the analog signal and to output the amplified analog signal, wherein the output buffer comprises the half-power buffer and/or amplifier defined in claim 1.

* * * * *